(12) United States Patent
Ono (10) Patent No.: US 10,057,978 B2
(45) Date of Patent: Aug. 21, 2018

(54) DISPLAY PANEL, METHOD FOR PRODUCING DISPLAY PANEL, AND FLEXIBLE PRINTED CIRCUIT BOARD

(71) Applicant: JOLED INC., Tokyo (JP)

(72) Inventor: Shinya Ono, Osaka (JP)

(73) Assignee: JOLED INC., Tokyo (JP)

( * ) Notice: Subject to any disclaimer, the term of this patent is extended or adjusted under 35 U.S.C. 154(b) by 14 days.

(21) Appl. No.: 15/514,864

(22) PCT Filed: Sep. 8, 2015

(86) PCT No.: PCT/JP2015/004574
§ 371 (c)(1),
(2) Date: Mar. 28, 2017

(87) PCT Pub. No.: WO2016/051681
PCT Pub. Date: Apr. 7, 2016

(65) Prior Publication Data
US 2017/0223824 A1    Aug. 3, 2017

(30) Foreign Application Priority Data

Sep. 30, 2014 (JP) ................................ 2014-199769

(51) Int. Cl.
*H05K 1/00* (2006.01)
*H05K 1/02* (2006.01)
(Continued)

(52) U.S. Cl.
CPC ......... *H05K 1/0268* (2013.01); *H01L 51/524* (2013.01); *H05K 1/118* (2013.01);
(Continued)

(58) Field of Classification Search
USPC .......................................... 361/749, 748, 751
See application file for complete search history.

(56) References Cited

U.S. PATENT DOCUMENTS

2006/0284821 A1    12/2006  Takenaka
2008/0048948 A1     2/2008  Koh et al.
(Continued)

FOREIGN PATENT DOCUMENTS

JP      2006-350064      12/2006
JP      2008-052248       3/2008

OTHER PUBLICATIONS

International Search Report (ISR) in International Pat. Appl. No. PCT/JP2015/004574, dated Dec. 8, 2015.

*Primary Examiner* — Andargie M Aychillhum
(74) *Attorney, Agent, or Firm* — Greenblum & Bernstein, P.L.C.

(57) ABSTRACT

A display panel including: a substrate; a plurality of first connecting wires in a first portion of the substrate and connected to a first flexible printed circuit board; a plurality of second connecting wires in a second portion of the substrate and connected to a second flexible printed circuit board, the second portion being adjacent to the first portion; first and second test pads provided between the first and second portions of the substrate, the first test pad being connected to an endmost first connecting wire adjacent to the second portion, the second test pad being connected to an endmost second connecting wire adjacent to the first portion; and an electrical circuit in which the endmost first and second connecting wires are included in different power supply nodes.

5 Claims, 7 Drawing Sheets (51) Int. Cl.
*H05K 1/18* (2006.01)
*H05K 1/14* (2006.01)
*H05K 1/11* (2006.01)
*H05K 3/28* (2006.01)
*H05K 3/00* (2006.01)
*H05K 3/36* (2006.01)
*H01L 51/52* (2006.01)

(52) U.S. Cl.
CPC ............ *H05K 1/144* (2013.01); *H05K 1/189* (2013.01); *H05K 3/0052* (2013.01); *H05K 3/0091* (2013.01); *H05K 3/28* (2013.01); *H05K 3/366* (2013.01); *H05K 2201/041* (2013.01); *H05K 2201/10128* (2013.01); *H05K 2203/162* (2013.01)

(56) References Cited

U.S. PATENT DOCUMENTS

| | | | |
|---|---|---|---|
| 2011/0317121 A1* | 12/2011 | Lin | G02F 1/133512 349/158 |
| 2013/0047420 A1* | 2/2013 | Ra | G06F 3/041 29/622 |
| 2015/0123933 A1* | 5/2015 | Jang | G06F 3/044 345/174 |

* cited by examiner

DISPLAY PANEL, METHOD FOR PRODUCING DISPLAY PANEL, AND FLEXIBLE PRINTED CIRCUIT BOARD

TECHNICAL FIELD

The present invention relates to a display panel, a method for producing the display panel, and a flexible printed circuit board.

BACKGROUND ART

Conventionally, a configuration is widely adopted in which a display device includes a driver integrated circuit (IC) for driving a display panel which is mounted on a flexible printed circuit board that connects the display panel and a circuit board, and causes the driver IC on the flexible printed circuit board to drive the display panel.

Moreover, a display device is known in which a lead wire is provided to such a flexible printed circuit board and which supplies a drive current from a circuit board to a display panel (see Patent Literature (PTL) 1, for example).

According to the display device disclosed in PTL 1, it is easy to supply a large amount of the drive current from the circuit board to the display panel via the lead wire provided to the flexible printed circuit board.

CITATION LIST

Patent Literature

[PTL 1] Japanese Unexamined Patent Application Publication No. 2008-52248

SUMMARY OF INVENTION

Technical Problem

A display panel which especially requires a large amount of a drive current, such as a display panel having a large screen, generally has high production costs of its own and high costs of a driver IC for driving. For this reason, it is important to check a degree of malfunction by a lighting test before a flexible printed circuit board is mounted, and correct a malfunctioning part or determine whether the flexible printed circuit board is worth being mounted.

The conventional display device, however, has no clear configuration for supplying a test drive current to the display panel on which the flexible printed circuit board is not yet mounted.

In view of this, the present invention has an object to provide a display panel having a configuration suitable for supplying a test drive current, a method for producing the display panel, and a flexible printed circuit board.

Solution to Problem

In order to solve the above problem, a display panel according to one disclosed aspect includes: a substrate; a plurality of first connecting wires provided to a first portion of a peripheral area of a main surface of the substrate and connected to a first flexible printed circuit board; a plurality of second connecting wires provided to a second portion of the peripheral area of the main surface of the substrate and connected to a second flexible printed circuit board, the second portion being adjacent to the first portion; a first test pad and a second test pad provided between the first portion and the second portion of the peripheral area of the main surface of the substrate, the first test pad being connected to, among the plurality of first connecting wires, an endmost first connecting wire adjacent to the second portion, the second test pad being connected to, among the plurality of second connecting wires, an endmost second connecting wire adjacent to the first portion; and an electrical circuit in which the endmost first connecting wire and the endmost second connecting wire are included in different power supply nodes.

Advantageous Effects of Invention

According to such a configuration, it is possible to cause the first test pad and the second test pad in a narrow space between the first portion and the second portion to receive drive currents and supply the drive currents to the respective different power supply nodes. Because the two test pads can be repeatedly provided between each pair of the adjacent flexible printed circuit boards, it is possible to supply large amounts of test drive currents by taking advantage of the narrow spaces remaining in the peripheral area of the display panel.

Moreover, that the endmost first connecting wire and the endmost second connecting wire are included in the different power supply nodes produces the following effect. Specifically, if the endmost first connecting wire and the endmost second connecting wire constitute the same power supply node, the first test pad can be directly connected to the same power supply node in the narrow space, but the second test pad needs to be connected to the different power supply node by a wire which makes a detour and has intersections. Accordingly, there is concern that a capacity to supply a drive current or reliability of wires is reduced. The aforementioned configuration solves such concern.

DESCRIPTION OF EMBODIMENTS

A display panel according to one disclosed aspect includes: a substrate; a plurality of first connecting wires provided to a first portion of a peripheral area of a main surface of the substrate and connected to a first flexible printed circuit board; a plurality of second connecting wires provided to a second portion of the peripheral area of the main surface of the substrate and connected to a second flexible printed circuit board, the second portion being adjacent to the first portion; a first test pad and a second test pad provided between the first portion and the second portion of the peripheral area of the main surface of the substrate, the first test pad being connected to, among the plurality of first connecting wires, an endmost first connecting wire adjacent to the second portion, the second test pad being connected to, among the plurality of second connecting wires, an endmost second connecting wire adjacent to the first portion; and an electrical circuit in which the endmost first connecting wire and the endmost second connecting wire are included in different power supply nodes.

According to such a configuration, it is possible to cause the first test pad and the second test pad in a narrow space between the first portion and the second portion to receive drive currents and supply the drive currents to the respective different power supply nodes. Because the two test pads can be repeatedly provided between each pair of the adjacent flexible printed circuit boards, it is possible to supply large amounts of test drive currents by taking advantage of the narrow spaces remaining in the peripheral area of the display panel.

Moreover, that the endmost first connecting wire and the endmost second connecting wire are included in the different power supply nodes produces the following effect. Specifically, if the endmost first connecting wire and the endmost second connecting wire constitute the same power supply node, the first test pad can be directly connected to the same power supply node in the narrow space, but the second test pad needs to be connected to the different power supply node by a wire which makes a detour and has intersections. Accordingly, there is concern that a capacity to supply a drive current or reliability of wires is reduced. The aforementioned configuration solves such concern.

Moreover, the display panel may further include a sealant which seals a central area of the main surface of the substrate other than the peripheral area, and wherein the first test pad and the second test pad may be respectively connected to the endmost first connecting wire and the endmost second connecting wire in the peripheral area.

According to such a configuration, for example, like an organic electroluminescent (EL) display panel, it is possible to cause the peripheral area to supply test power in the display panel of which the central area is sealed.

Moreover, among the plurality of first connecting wires and the plurality of second connecting wires, connecting wires included in different nodes in the electrical circuit may not intersect with each other in the peripheral area.

According to such a configuration, it is possible to avoid a problem which arises when the connecting wires included in the different nodes are intersected with each other in the peripheral area which is not sealed, that is, a problem that wires are susceptible to deterioration due to a potential difference between wires in a corrosive environment.

Moreover, a method for producing a display panel according to one disclosed aspect includes: providing a plurality of first connecting wires connected to a first flexible printed circuit board and a plurality of second connecting wires connected to a second flexible printed circuit board, respectively to a first portion and a second portion of a peripheral area of a main surface of a substrate, the first portion and the second portion being adjacent to each other; providing a first test pad and a second test pad between the first portion and the second portion of the peripheral area of the main surface of the substrate, the first test pad being connected to, among the plurality of first connecting wires, an endmost first connecting wire adjacent to the second portion, the second test pad being connected to, among the plurality of second connecting wires, an endmost second connecting wire adjacent to the first portion; and forming on the substrate an electrical circuit in which the endmost first connecting wire and the endmost second connecting wire are included in different power supply nodes.

The display panel producing the aforementioned effect can be produced according to such a method.

Moreover, a method for producing a display according to one disclosed aspect includes: forming, on a raw substrate as big as a plurality of the substrates, the plurality of first connecting wires, the plurality of second connecting wires, the first test pad, the second test pad, and the electrical circuit included in each of the plurality of the substrates, in positions in which a plurality of the peripheral areas of adjacent substrates among the plurality of the substrates are adjacent to each other, in accordance with the method for producing the display panel according to the aforementioned method; dividing the raw substrate into the plurality of the substrates at boundaries with the plurality of the peripheral areas of the adjacent substrates; electrically testing, for each of the plurality of the substrates resulting from the dividing, the electrical circuit via the first test pad and the second test pad; and attaching a flexible printed circuit board to each substrate having passed the testing.

According to such a method, the substrates including the first test pad and the second test pad and having the final product size can be obtained by the single division based on the structural characteristics in which the first test pad and the second test pad are provided in the narrow space of the peripheral area of the substrate. For example, a production method is conceivable in which a raw substrate is divided into half-finished products in which substrates having a final product size and dedicated areas of test pads are connected, a test is performed using the test pads, and the substrates having the final product size are subsequently obtained by further dividing the half-finished products. As compared to such a production method, the aforementioned method makes it possible to obtain the substrates having the final product size by the single division, which has a considerable practical significance.

Moreover, a flexible printed circuit board according to one disclosed aspect is a flexible printed circuit board to be attached to the display panel, wherein in a case where, in the display panel, an endmost first connecting wire, among the plurality of first connecting wires, far from the second portion and the endmost second connecting wire adjacent to the first portion are included in the same power supply node in the electrical circuit, and the endmost first connecting wire adjacent to the second portion and an endmost second connecting wire, among the plurality of second connecting wires, far from the first portion are included in the same power supply node in the electrical circuit, the flexible printed circuit board comprising a pair of lead wires having substantially the same electrical characteristics, in both ends of the flexible printed circuit board.

According to such a configuration, the following effect can be produced as compared to a case where a pair of lead wires having different electrical characteristics is provided at the both ends of the flexible printed circuit board.

Power supply wires of the display panel are sometimes provided symmetrically. For example, a power supply node including the leftmost connecting wire and a power supply node including the rightmost connecting wire are sometimes reverse between the left area and the right area of the display panel, the left most connecting wire and the rightmost connecting wire being among the connecting wires connected to one of the flexible printed circuit boards. Here, if the width of the lead wires in the both ends of the flexible printed circuit board is changed according to an amount of current passing through the power supply nodes, at least two types of the flexible printed circuit boards become necessary because the left area and the right area of the display panel differ in the power supply nodes connected to the lead wires in the both ends.

In contrast, according to the aforementioned configuration, one type of the flexible printed circuit boards can be used for the left area and the right area of the display panel, which eliminates the need to prepare several types of flexible printed circuit boards.

Embodiment

Hereinafter, a display panel, a method for producing the display panel, and a flexible printed circuit board according to one aspect of the present invention will be described with reference to the drawings.

It is to be noted that each of embodiments described below represents a specific example of the present invention. The numerical values, shapes, materials, structural elements, the arrangement and connection of the structural elements, production steps, the processing order of the production steps, etc. shown in the following embodiments are mere examples, and therefore do not limit the present invention. Moreover, among the structural elements in the following embodiments, structural elements not recited in any one of the independent claims which indicate the broadest concepts are described as optional structural elements.

Figure 1:
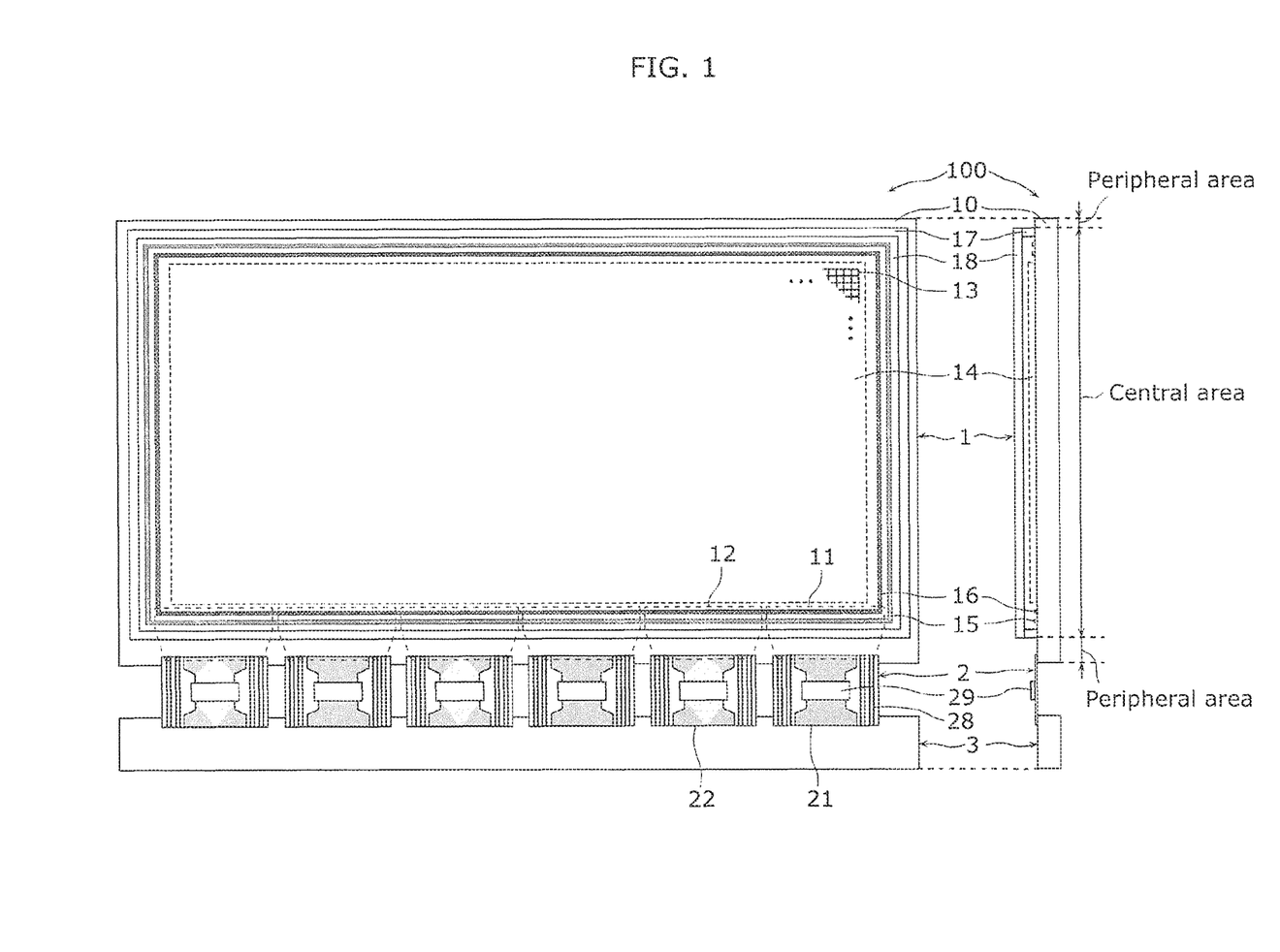
FIG. 1 is a front view and a right side view illustrating an exemplary configuration of a display device according to an embodiment.

FIG. 1 is a front view and a right side view illustrating an exemplary configuration of a display device according to an embodiment.

As illustrated in FIG. 1, a display device 100 includes a display panel 1, flexible printed circuit boards 2, and a circuit board 3.

The display panel 1 is, for example, an image display panel such as an organic EL display panel. As an example, the display panel 1 is produced: by forming, in the central area of a main surface of a substrate 10, a display unit 14 including pixel units 13 arranged in a matrix, and a first power supply wire 15 and a second power supply wire 16 for supplying operating power to the pixel units 13; and by sealing these elements with a sealant 17 and a sealing substrate 18. The peripheral area of the main surface of the substrate 10 is not sealed to ensure electrical connection, and the central area of the main surface of the substrate 10 other than the peripheral area is sealed.

The peripheral area of the main surface of the substrate 10 is provided with connecting wires connected to the flexible printed circuit boards 2. The connecting wires will be described in detail below.

The flexible printed circuit boards 2 are provided with lead wires 28 and mounted with driver ICs 29. The flexible printed circuit hoards 2 are electrically connected with the substrate 10 in the peripheral area of the main surface of the substrate 10, supply a drive current from the circuit board 3 to the display panel 1 via the lead wires 28, and cause the driver ICs 29 to drive the display panel 1.

Hereinafter, two adjacent flexible printed circuit boards among the flexible printed circuit boards 2 are referred to as a first flexible printed circuit board 21 and a second flexible printed circuit board 22.

Figure 2:
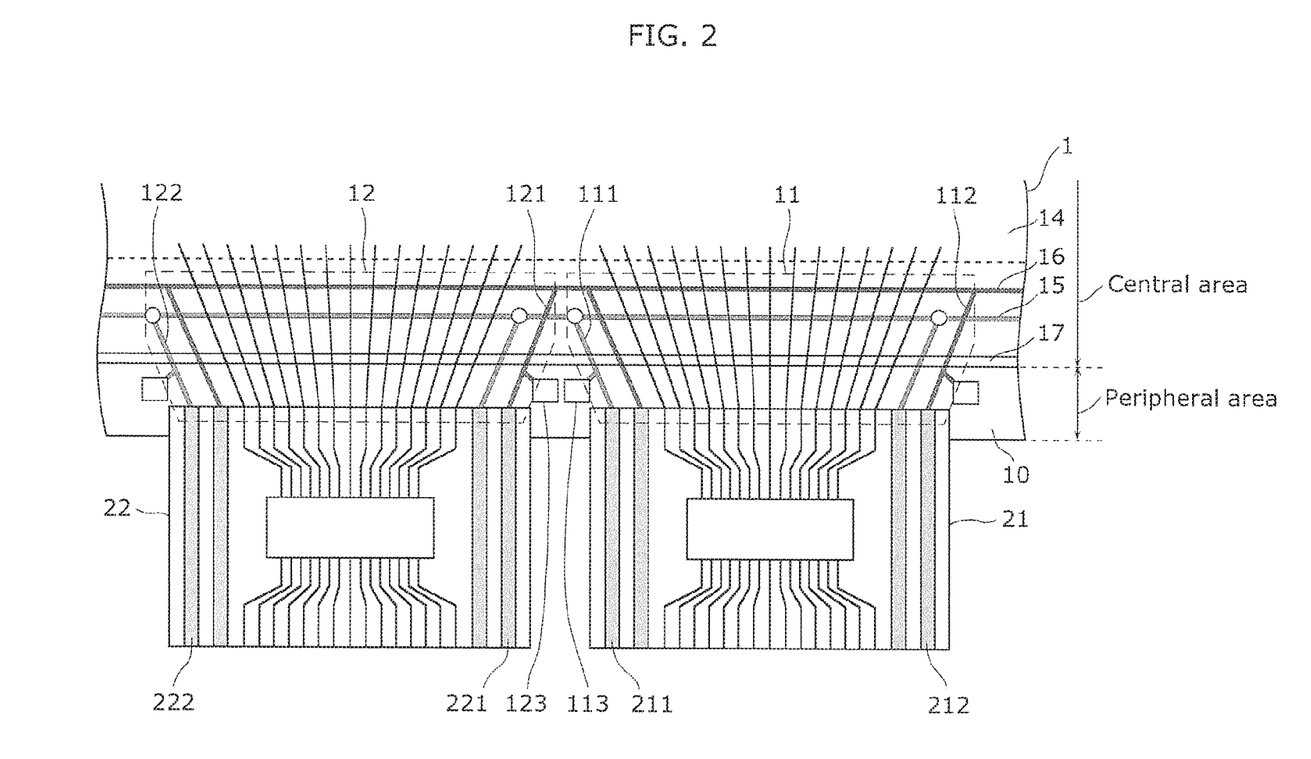
FIG. 2 is an enlarged view illustrating an exemplary configuration of a connection portion between a display panel and flexible printed circuit boards according to the embodiment.

FIG. 2 is an enlarged view illustrating an exemplary configuration of a connection portion between the display panel 1 and the first and second flexible printed circuit boards 21 and 22.

A first portion of the peripheral area of the main surface of the substrate 10 is provided with first connecting wires 11 connected to the first flexible printed circuit board 21.

A second portion, adjacent to the first portion, of the peripheral area of the main surface of the substrate 10 is provided with second connecting wires 12 connected to the second flexible printed circuit board 22.

Among the first connecting wires 11, an endmost first connecting wire adjacent to the second portion and an endmost first connecting wire far from the second portion are referred to as first connecting wires 111 and 112, respectively.

Among the second connecting wires 12, an endmost second connecting wire adjacent to the first portion and an endmost second connecting wire far from the first portion are referred to as second connecting wires 121 and 122, respectively.

A first test pad 113 connected to the first connecting wire 111 and a second test pad 123 connected to the second connecting wire 121 are provided between the first portion and second portion of the peripheral area of the substrate 10. Both the connection between the first test pad 113 and the first connecting wire 111 and the connection between the second test pad 123 and the second connecting wire 121 are in the peripheral area.

The first connecting wires 11 and the second connecting wires 12 enter the sealed central area under, for example, the sealant 17, and are connected to an electrical circuit in the central area.

Specifically, the first connecting wire 111 is connected to the first power supply wire 15, and the second connecting wire 121 is connected to the second power supply wire 16. As a typical example, the first power supply wire 15 and the first connecting wire 111 may constitute a positive power supply node, and the second power supply wire 16 and the second connecting wire 121 may constitute a negative power supply node. As seen above, the first connecting wire 111 and the second connecting wire 121 are included in different power supply nodes, that is, nodes through each of which a drive current having a different voltage passes.

According to the display panel 1 thus configured as above, it is possible to cause the first test pad 113 and the second test pad 123 in a narrow space between the first portion and the second portion to receive the drive currents and supply the drive currents to the respective different power supply nodes.

The display panel 1 has a repeating pattern in which the first connecting wire 111 and the second connecting wire 122 constitute the same power supply node and the first connecting wire 112, and the second connecting wire 121 constitute the same power supply node. For this reason, it is possible to repeatedly provide test pads equivalent to the first test pad 113 and the second test pad 123 in a space between a pair of adjacent flexible printed circuit boards 2 other than the space between the flexible printed circuit boards 21 and 22. With this, it is possible to supply large amounts of test drive currents by taking advantage of the narrow spaces remaining in the peripheral area of the display panel 1.

Moreover, that the first connecting wire 111 and the second connecting wire 121 are included in the different power supply nodes produces the following effect. This effect will be described by comparison with Comparative Example 1 in which the first connecting wire 111 and the second connecting wire 121 constitute the same power supply node.

Figure 3:
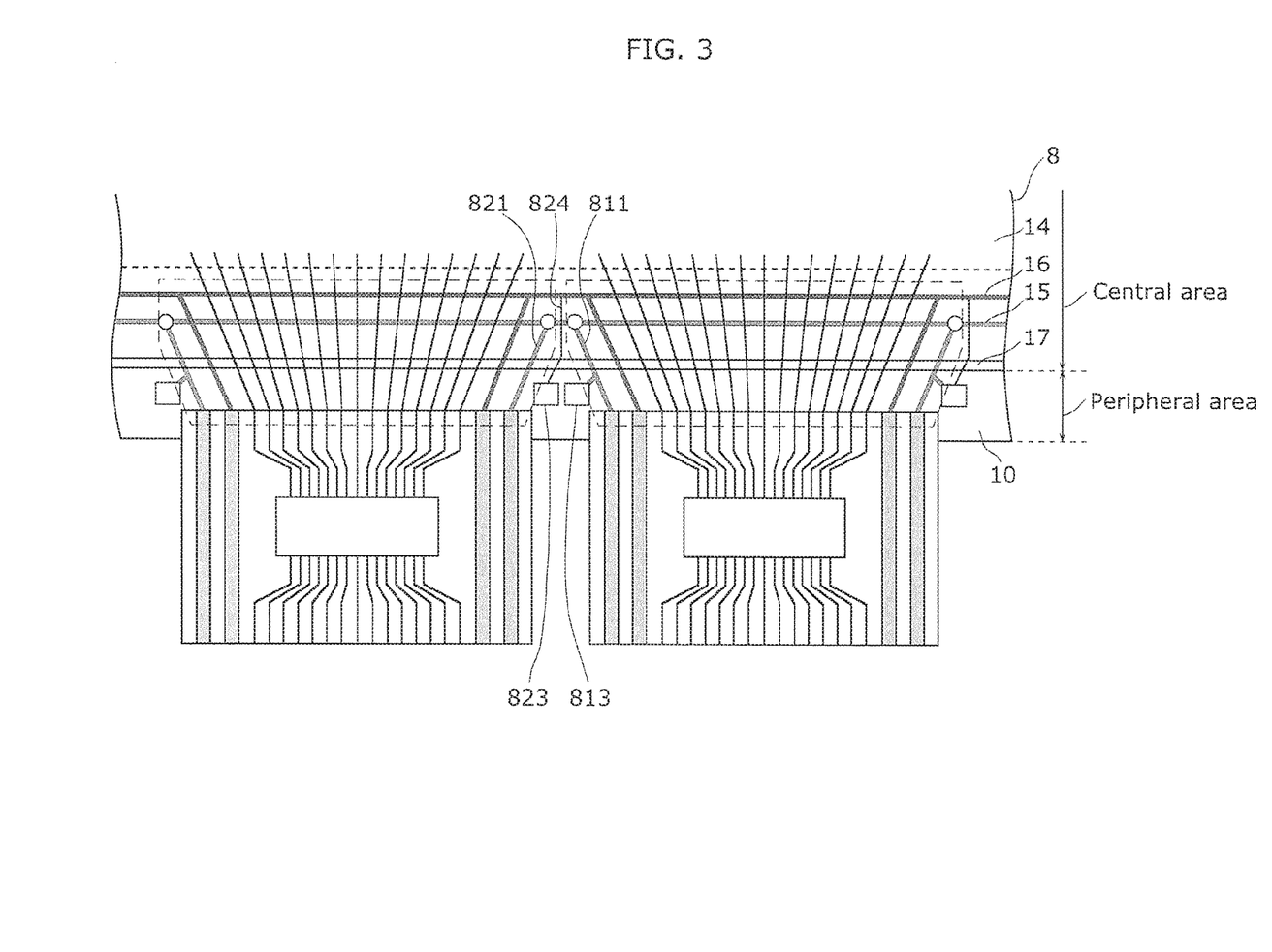
FIG. 3 is an enlarged view illustrating an exemplary configuration of a connection portion between a display panel and flexible printed circuit boards according to Comparative Example 1.

FIG. 3 is an enlarged view illustrating an exemplary configuration of a connection portion between a display panel and flexible printed circuit boards according to Comparative Example 1.

As illustrated in FIG. 3, a first connecting wire 811 and a second connecting wire 821 constitute the same power supply node in a display panel 8 according to Comparative Example 1, while the first connecting wire 111 and the second connecting wire 121 are included in the different power supply nodes in the display panel 1 according to the embodiment.

A first test pad 813 can be connected to the same power supply node in a narrow space because the first connecting wire 811 and the second connecting wire 821 constitute the same power supply node in the display panel 8. It is, however, necessary to connect a second test pad 823 to a different power supply node by a wire 824 which makes a detour and has intersections.

The wire 824 for a detour cannot be provided thickly in the peripheral area in which connecting wires cluster. Consequently, there is concern that the second test pad 823 which is connected to the second power supply wire 16 by the wire 824 has an insufficient capacity to supply a drive current. Moreover, if the wire 824 were intersected with a wire included in another node in the unsealed peripheral area, a problem would arise in which, for example, wires are prone to corrosion due to a potential difference between the wires.

In contrast, the configuration of the display panel 1 does not cause such concern and problem.

Especially to increase degradation resistance of wires, the display panel 1 has a pattern in which not only the wires connected to the first test pad 113 and the second test pad 123 but also any pairs of, among the first connecting wires 11 and the second connecting wires 12, connecting wires constituting different nodes do not intersect with each other in the peripheral area.

It is to be noted that the first flexible printed circuit board 21 supplies a drive current via a pair of the lead wires 211 and 212 provided to the both ends of the first flexible printed circuit board 21 and another pair of lead wires (reference signs omitted) provided between the lead wires 211 and 212. Moreover, the second flexible printed circuit board 22 similarly supplies a drive current via a pair of the lead wires 221 and 222 provided to the both ends of the second flexible printed circuit board 22 and another pair of lead wires (reference signs omitted) provided between the lead wires 221 and 222. Although providing many lead wires as above has an advantage in increasing the capacity to supply a drive current, it has nothing particular to do with the aforementioned effect.

In light of the above, hereinafter, a configuration in which a flexible printed circuit board including only a pair of lead wires at the both ends of the flexible printed circuit board is used will be described as a variation of the embodiment.

Figure 4:
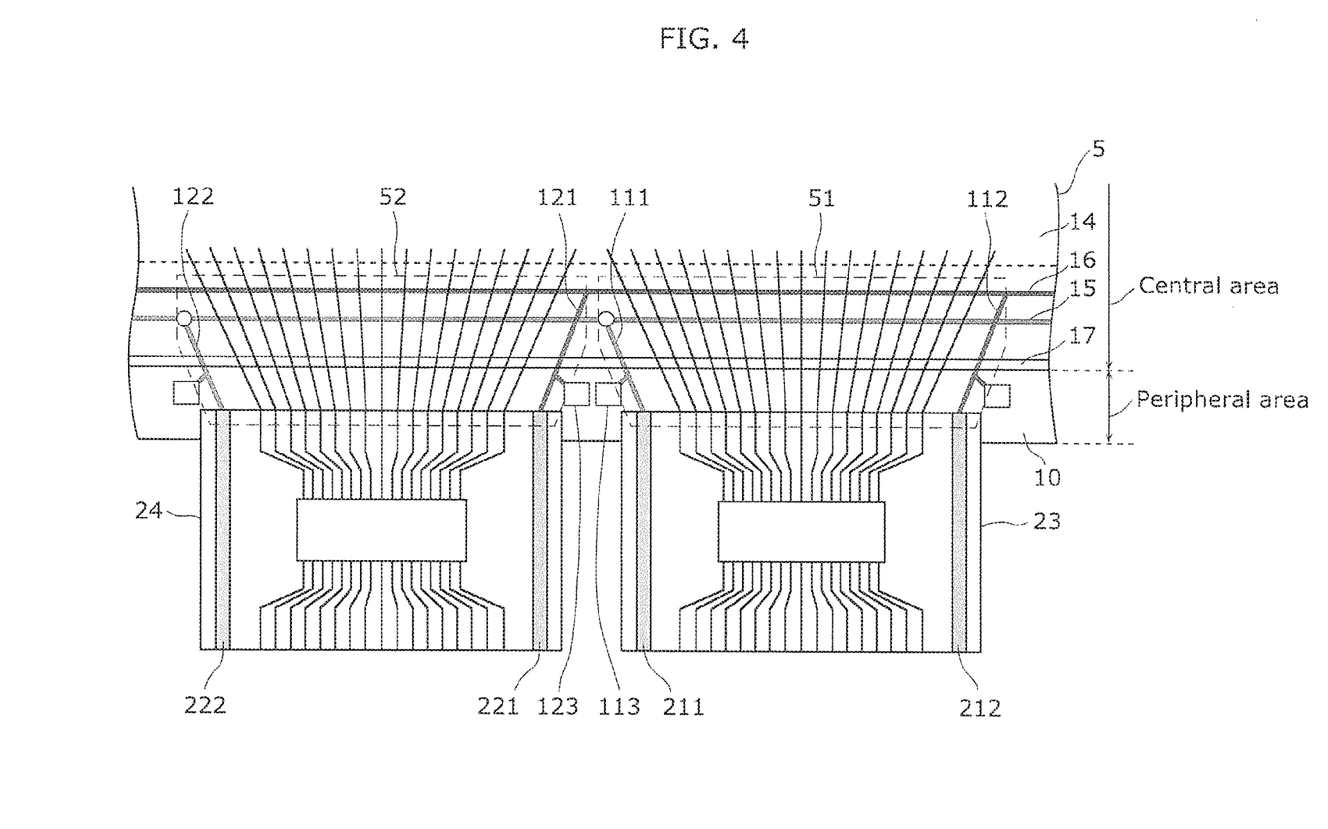
FIG. 4 is an enlarged view illustrating an exemplary configuration of a connection portion between a display panel and flexible printed circuit boards according to a variation of the embodiment.

FIG. 4 is an enlarged view illustrating an exemplary configuration of a connection portion between a display panel and flexible printed circuit boards according to the variation of the embodiment.

As illustrated in FIG. 4, flexible printed circuit boards 23 and 24 are configured by deleting the internal pairs of the lead wires of the flexible printed circuit boards 21 and 22 illustrated in FIG. 2, respectively. Moreover, among first connecting wires 51 and second connecting wires 52, connecting wires corresponding to the deleted lead wires are omitted from a display panel 5.

As is clear from FIG. 4, the display panel 5 has in common with the display panel 1 in the arrangement of the first connecting wire 111, the second connecting wire 121, the first test pad 113, and the second test pad 123 and structural characteristics regarding the connection between these structural elements and the first power supply wire 15 and the second power supply wire 16.

Accordingly, the display panel 5 also produces the same effect as the effect of the display panel 1 described in the embodiment.

Next, the characteristics of the flexible printed circuit boards 21 and 22 will be described.

In FIG. 2, the lead wires 211 and 212 in the both ends of the flexible printed circuit board 21 are shown in the same shape, and the lead wires 221 and 222 in the both ends of the flexible printed circuit board 22 are shown in the same shape. This illustration indicates that the flexible printed circuit boards 21 and 22 each include in the both ends the pair of the lead wires having substantially the same electrical characteristics.

Providing the pair of the lead wires having substantially the same electrical characteristics to the both ends of the flexible printed circuit board produces the following effect. This effect will be described by comparison with Comparative Example 2 in which lead wires having different electrical characteristics are provided to the both ends of flexible printed circuit board.

Figure 5:
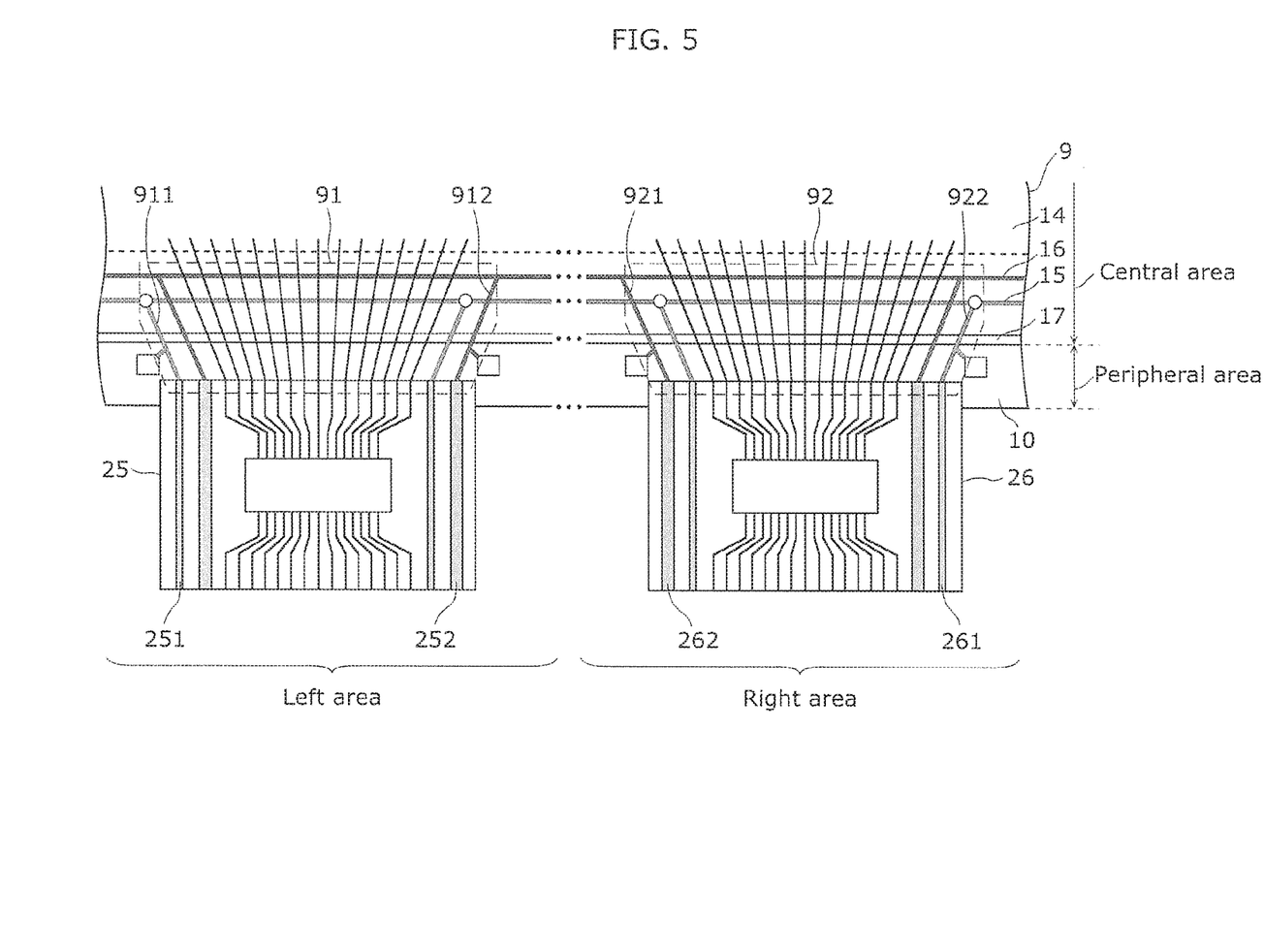
FIG. 5 is an enlarged view illustrating an exemplary configuration of a connection portion between a display panel and flexible printed circuit boards according to Comparative Example 2.

FIG. 5 is an enlarged view illustrating an exemplary configuration of a connection portion between a display panel and flexible printed circuit boards according to Comparative Example 2.

As illustrated in FIG. 5, power supply wires of a display panel 9 are provided symmetrically according to a commonly adopted design technique.

As a result, in the left area of the display panel 9, among connecting wires 91 connected to a flexible printed circuit board 25, a leftmost connecting wire 911 is connected to the first power supply wire 15, and a rightmost connecting wire 912 is connected to the second power supply wire 16.

In contrast, in the right area of the display panel 9, among connecting wires 92 connected to a flexible printed circuit board 26, a leftmost connecting wire 921 is connected to the second power supply wire 16, and a rightmost connecting wire 922 is connected to the first power supply wire 15.

In other words, a power supply node including the leftmost connecting wire and a power supply node including the rightmost connecting wire are reverse between the left area and the right area of the display panel 9, the left most connecting wire and the rightmost connecting wire being among the connecting wires connected to one of the flexible printed circuit boards.

Here, as illustrated in FIG. 5, it is conceivable to change the width of lead wires 251 and 252 in the both ends of the flexible printed circuit board 25 and the width of lead wires 261 and 262 in the both ends of the flexible printed circuit board 26 depending on an amount of current passing through the power supply nodes. However, if the widths are changed, at least two types of the flexible printed circuit boards 25 and 26 are necessary for the left area and the right area of the display panel 9, which may inhibit rationalization of production costs.

In contrast, according to the configuration in which the pair of the lead wires having substantially the same electrical characteristics is provided to the both ends of the flexible printed circuit hoard, one type of flexible printed circuit boards can be used for the left area and the right area of the display panel, which eliminates the need to prepare several types of flexible printed circuit boards.

Next, a method for producing the display panel 1 will be described.

Figure 6:
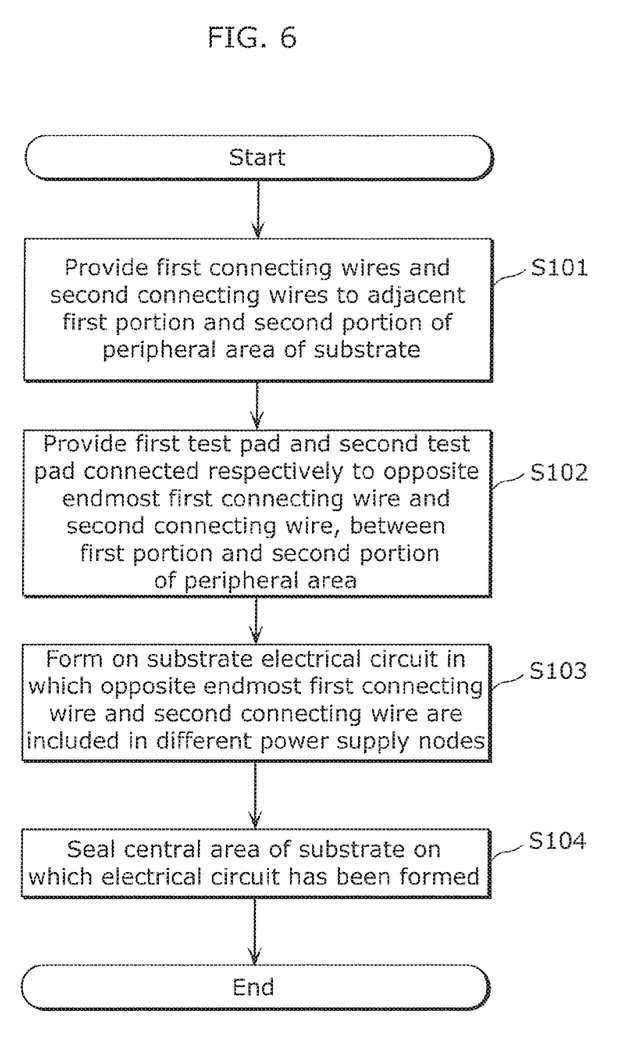
FIG. 6 is a flow chart illustrating an exemplary method for producing the display device according to the embodiment.

FIG. 6 is a flow chart illustrating an exemplary method for producing the display device 1. Although the structural elements are referred to by the corresponding reference signs of FIG. 1 and FIG. 2 in the following description for better understanding, the following description is not intended to be restrictively applied to production of a specific display panel.

As illustrated in FIG. 6, the method for producing the display panel 1 includes at least the following steps.

A step for providing the first connecting wires 11 connected to the first flexible printed circuit board 21 and the second connecting wires 12 connected to the second flexible printed circuit board 22 to the first portion and the second portion, which are adjacent to each other, of the peripheral area of the main surface of the substrate 10, respectively (S101).

A step for providing the first test pad 113 and the second test pad 123 connected respectively to the opposite endmost first connecting wire 111 and second connecting wire 121 (that is, the endmost first connecting wire 111 adjacent to the second portion and the endmost second connecting wire 121 adjacent to the first portion), between the first portion and the second portion of the peripheral area (S102).

A step for forming on the substrate 10 an electrical circuit in which the first connecting wire 111 and the second connecting wire 121 are included in different power supply nodes (S103). Here, the electrical circuit includes a circuit composed of the first connecting wire 111, the second connecting wire 121, the first test pad 113, the second test pad 123, the first power supply wire 15, the second power supply wire 16, and wires and the pixel units 13 in the display unit 14.

A step for sealing the central area of the substrate 10 on which the electrical circuit is formed (S104).

It is to be noted that such a method is characterized by the structures of the first connecting wires, the second connecting wires, the first test pad, the second test pad, and the electrical circuit that are produced, and processing methods used for forming these structural elements are not particularly limited. Well-known processes such as photolithography and etching may be used for forming the structural elements. Moreover, the order of forming the structural elements is changeable, and the structural elements may be formed in a single step.

The display panel 1 producing the aforementioned effect is produced according to the aforementioned method.

The display panel 1 is structurally characterized in that the first test pad 113 and the second test pad 123 are provided in a narrow space in the peripheral area of the substrate 10 (that is, within the final product size of the substrate 10). For this characteristic, the display panel 1 is especially suitable for multiple-substrate production. Hereinafter, the characteristic will be described using another example of the method.

Figure 7:
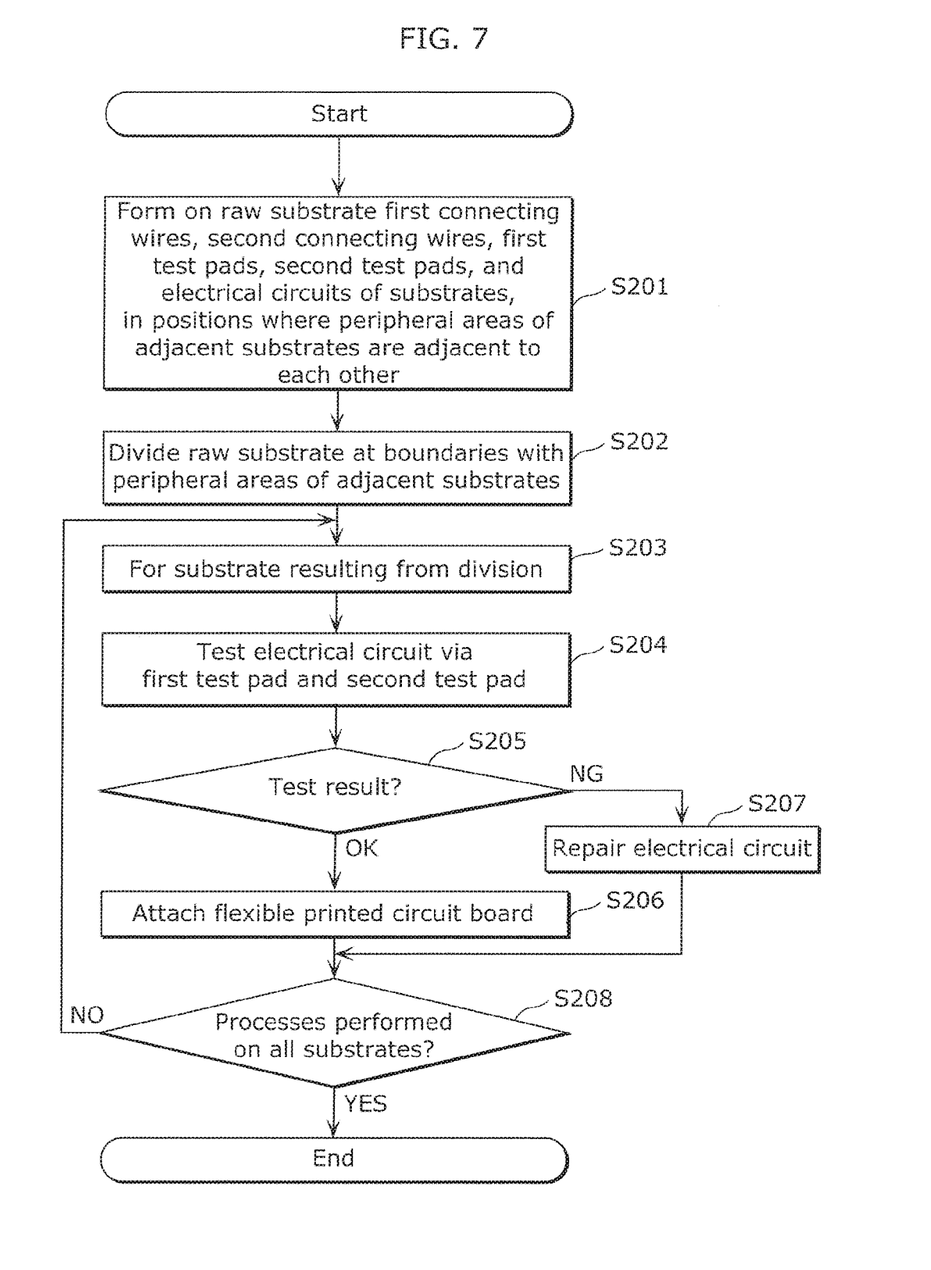
FIG. 7 is a flow chart illustrating another exemplary method for producing the display device according to the embodiment.

FIG. 7 is a flow chart illustrating another exemplary method for producing the display device 1. Although the structural elements are referred to by the corresponding reference signs of FIG. 1 and FIG. 2 in the following description for better understanding, the following description is not intended to be restrictively applied to production of a specific display panel.

As illustrated in FIG. 7, according to the other method for producing the display panel 1, the first connecting wires 11, the second connecting wires 12, the first test pads 113, the second test pads 123, and electrical circuits of a plurality of the substrates 10 are formed on a raw substrate (not shown) as big as the substrates 10 (S201). These structural elements are formed in positions where peripheral areas of adjacent substrates 10 among the substrates 10 are adjacent to each other, according to the aforementioned method for producing the display panel 1.

The raw substrate is divided into the substrates 10 at boundaries with the peripheral areas of the adjacent substrates 10 (S202).

The following processes are performed on each of the substrates 10 resulting from the division (S203).

The electrical circuit is electrically tested via the first test pad 113 and the second test pad 123 of the substrate 10 (S204). The test content is not particularly limited, but may be a lighting test of the pixel units 30 as a typical example. A flexible printed circuit board is attached to the substrate 10 having passed the test (OK in S205) (S206). Regarding the substrate 10 having failed the test (NG in S205), the electrical circuit is repaired by, for example, a process of changing bright spots into dark spots or separation of a short-circuited part of a wire (S207). These processes are performed on all of the substrates 10 (S208).

According to the aforementioned method, the substrates including the test pads and having the final product size can be obtained by the single division based on the structural characteristic of the display panel 1 in which the test pads are provided within the final product size of the substrates 10. For example, a production method is conceivable in which a raw substrate is divided into half-finished products in which substrates having a final product size and dedicated areas of test pads are connected, a test is performed using the test pads, and the substrates having the final product size are subsequently obtained by further dividing the half-finished products. As compared to such a production method, the aforementioned method makes it possible to obtain the substrates having the final product size by the single division, which has a considerable practical significance.

Although the display panel, the method for producing the display panel, and the flexible printed circuit board according to one or more aspects of the present invention have been described above based on the foregoing embodiment, the present invention is not limited to the embodiment. The scope of the one or more aspects of the present invention may include forms obtained by various modifications to the embodiment that can be conceived by a person skilled in the art as well as forms realized by combining structural elements in different embodiments, as long as the forms do not depart from the essence of the present invention.

INDUSTRIAL APPLICABILITY

The present invention can be widely applied as an image display device.

The invention claimed is:

1. A display panel comprising: a substrate; a plurality of first connecting wires provided to a first portion of a peripheral area of a main surface of the substrate and connected to a first flexible printed circuit board; a plurality of second connecting wires provided to a second portion of the peripheral area of the main surface of the substrate and connected to a second flexible printed circuit board, the second portion being adjacent to the first portion; a first test pad and a second test pad provided between the first portion and the second portion of the peripheral area of the main surface of the substrate, the first test pad being connected to, among the plurality of first connecting wires, an endmost first connecting wire adjacent to the second portion, the second test pad being connected to, among the plurality of second connecting wires, an end most second connecting wire adjacent to the first portion; and an electrical circuit in which the endmost first connecting wire and the endmost second connecting wire are included in different power supply nodes, further comprising a sealant which seals a central area of the main surface of the substrate other than the peripheral area, wherein the first test pad and the second test pad are respectively connected to the endmost first connecting wire and the endmost second connecting wire in the peripheral area.

2. The display panel according to claim 1,
wherein among the plurality of first connecting wires and the plurality of second connecting wires, connecting wires included in different nodes in the electrical circuit do not intersect with each other in the peripheral area.

3. A method for producing a display panel, the method comprising:
providing a plurality of first connecting wires connected to a first flexible printed circuit board and a plurality of second connecting wires connected to a second flexible printed circuit board, respectively to a first portion and a second portion of a peripheral area of a main surface of a substrate, the first portion and the second portion being adjacent to each other;
providing a first test pad and a second test pad between the first portion and the second portion of the peripheral area of the main surface of the substrate, the first test pad being connected to, among the plurality of first connecting wires, an endmost first connecting wire adjacent to the second portion, the second test pad being connected to, among the plurality of second connecting wires, an endmost second connecting wire adjacent to the first portion; and
forming on the substrate an electrical circuit in which the endmost first connecting wire and the endmost second connecting wire are included in different power supply nodes.

4. A method for producing a display panel, the method comprising:
forming, on a raw substrate as big as a plurality of the substrates, the plurality of first connecting wires, the plurality of second connecting wires, the first test pad, the second test pad, and the electrical circuit included in each of the plurality of the substrates, in positions in which a plurality of the peripheral areas of adjacent substrates among the plurality of the substrates are adjacent to each other, in accordance with the method for producing the display panel according to claim 3;
dividing the raw substrate into the plurality of the substrates at boundaries with the plurality of the peripheral areas of the adjacent substrates;
electrically testing, for each of the plurality of the substrates resulting from the dividing, the electrical circuit via the first test pad and the second test pad; and
attaching a flexible printed circuit board to each substrate having passed the testing.

5. A flexible printed circuit board to be attached to the display panel according to claim 1,
wherein in a case where, in the display panel, an endmost first connecting wire, among the plurality of first connecting wires, far from the second portion and the endmost second connecting wire adjacent to the first portion are included in the same power supply node in the electrical circuit, and the endmost first connecting wire adjacent to the second portion and an endmost second connecting wire, among the plurality of second connecting wires, far from the first portion are included in the same power supply node in the electrical circuit,
the flexible printed circuit board comprising a pair of lead wires having substantially the same electrical characteristics, in both ends of the flexible printed circuit board.

* * * * *